United States Patent
Leeson et al.

(10) Patent No.: US 7,169,620 B2
(45) Date of Patent: Jan. 30, 2007

(54) METHOD OF REDUCING THE SURFACE ROUGHNESS OF SPIN COATED POLYMER FILMS

(75) Inventors: Michael J. Leeson, Portland, OR (US); Ebrahim Andideh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 418 days.

(21) Appl. No.: 10/676,738

(22) Filed: Sep. 30, 2003

(65) Prior Publication Data

US 2005/0079728 A1   Apr. 14, 2005

(51) Int. Cl.
*H01L 21/00* (2006.01)

(52) U.S. Cl. .......................... 438/3; 438/680; 438/964; 438/622; 257/E21; 257/242; 257/264

(58) Field of Classification Search .............. 438/3, 438/622, 197, 680, 648, 678, 712, 745, 738, 438/683, 685, 688
See application file for complete search history.

(56) References Cited

U.S. PATENT DOCUMENTS

| | | | |
|---|---|---|---|
| 5,057,623 A * | 10/1991 | Kai et al. ..................... 564/82 |
| 5,795,684 A | 8/1998 | Troccolo | |
| 6,429,095 B1 * | 8/2002 | Sakaguchi et al. .......... 438/458 |
| 6,503,600 B2 * | 1/2003 | Watanabe et al. ........ 428/846.9 |
| 2003/0224535 A1 | 12/2003 | Andideh et al. | |
| 2004/0086809 A1 | 5/2004 | Goodner et al. | |
| 2004/0102054 A1 | 5/2004 | Leeson et al. | |
| 2004/0132285 A1 | 7/2004 | Andideh et al. | |
| 2004/0157170 A1 | 8/2004 | Waldfried et al. | |
| 2004/0214009 A1 | 10/2004 | Andideh | |
| 2004/0217402 A1 | 11/2004 | Andideh | |
| 2004/0256649 A1 | 12/2004 | Andideh | |
| 2005/0070032 A1 | 3/2005 | Richards et al. | |

* cited by examiner

*Primary Examiner*—David Nhu
(74) *Attorney, Agent, or Firm*—Blakely, Sokoloff, Taylor & Zafman LLP

(57) ABSTRACT

According to one aspect of the invention, a method of constructing a memory array is provided. An insulating layer is formed on a semiconductor wafer. A first metal stack is then formed on the insulating layer and etched to form first metal lines. A polymeric layer is formed over the first metal lines and the insulating layer. A puddle of smoothing solvent is then allowed to stand on the wafer. The smoothing solvent is then removed. After the smoothing solvent is removed, the polymeric layer has a reduced surface roughness. A second metal stack is then formed on the polymeric layer and etched to form second metal lines.

22 Claims, 10 Drawing Sheets

METHOD OF REDUCING THE SURFACE ROUGHNESS OF SPIN COATED POLYMER FILMS

BACKGROUND OF THE INVENTION

1). Field of the Invention

This invention relates to an electronic assembly and a method of constructing an electronic assembly.

2). Discussion of Related Art

Ferroelectric polymer memory chips, like other integrated circuits, are formed on semiconductor wafers. An insulating layer is typically formed on the wafer first. A lower set of electrodes is formed on the insulating layer over which a polymeric layer is then deposited.

After the polymer is cured and/or annealed, a series of topographic formations or a "roughness," manifests on the surface of the polymeric layer. These formations can be on the order of the thickness of the substrate and can include valleys, which extend to the lower electrodes and/or insulating layer below.

An upper set of electrodes is then formed on the polymeric layer. The metals used in the upper electrodes can be reactive with the polymer. If these materials make contact, a chemical reaction may begin which leads to failure of the device. Additionally, if the topography of the polymeric layer is bad enough, the upper and lower electrode can make actual electrical contact, which will cause the device to short circuit. Typically, an interface layer is formed between the upper electrodes and the polymeric layer to prevent such contact from taking place. However, because of the size of the topographic formations and the roughness of the polymeric layer, the interface layer is often not effective in separating the electrode from the polymeric layer.

BRIEF DESCRIPTION OF THE DRAWINGS

The invention is described by way of example with reference to accompanying drawings, wherein.

DETAILED DESCRIPTION OF THE INVENTION

FIG. 1 to FIG. 15 illustrate a memory array and a method of constructing a memory array. An insulating layer is formed on a semiconductor wafer. A first metal stack is then formed on the insulating layer and etched to form first metal lines. A polymeric layer is formed over the first metal lines and the insulating layer. A puddle of smoothing solvent is then allowed to stand on the wafer. The smoothing solvent is then removed. After the smoothing solvent is removed, the polymeric layer has a reduced surface roughness. A second metal stack is then formed on the polymeric layer and etched to form second metal lines and complete the memory array.

Figure 1:
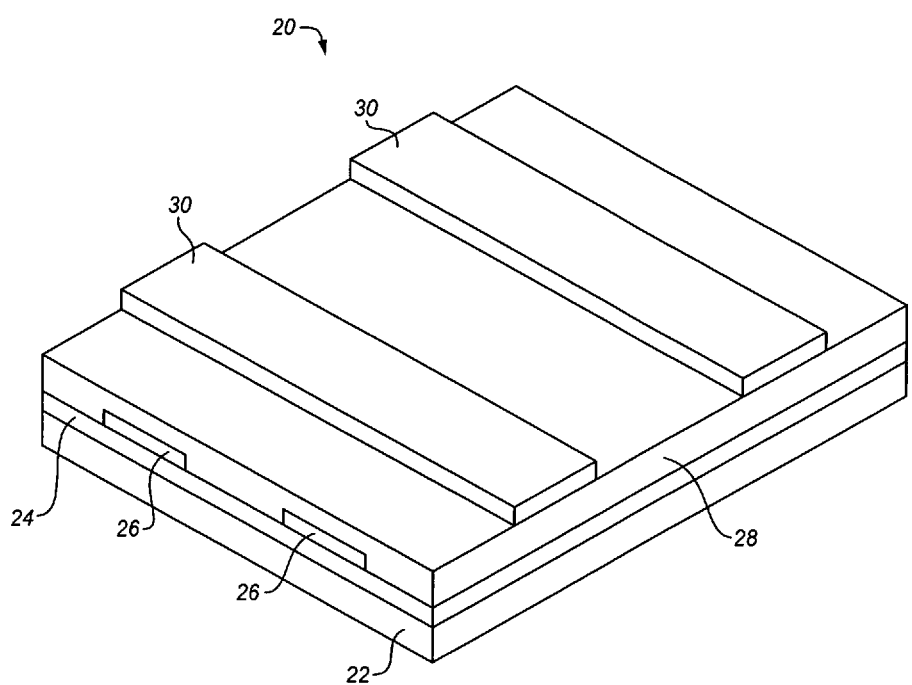
FIG. 1 is a perspective view of a memory array including a substrate, and insulating layer, lower metal lines, a polymeric layer, and upper metal lines.

FIG. 1 illustrates a ferroelectric polymer memory array 20. The memory array 20 may include a substrate 22, an insulating layer 24, lower metal lines 26, a polymeric layer 28, and upper metal lines 30.

FIGS. 2–12 illustrate a process for constructing the memory array 20.

Figure 2:
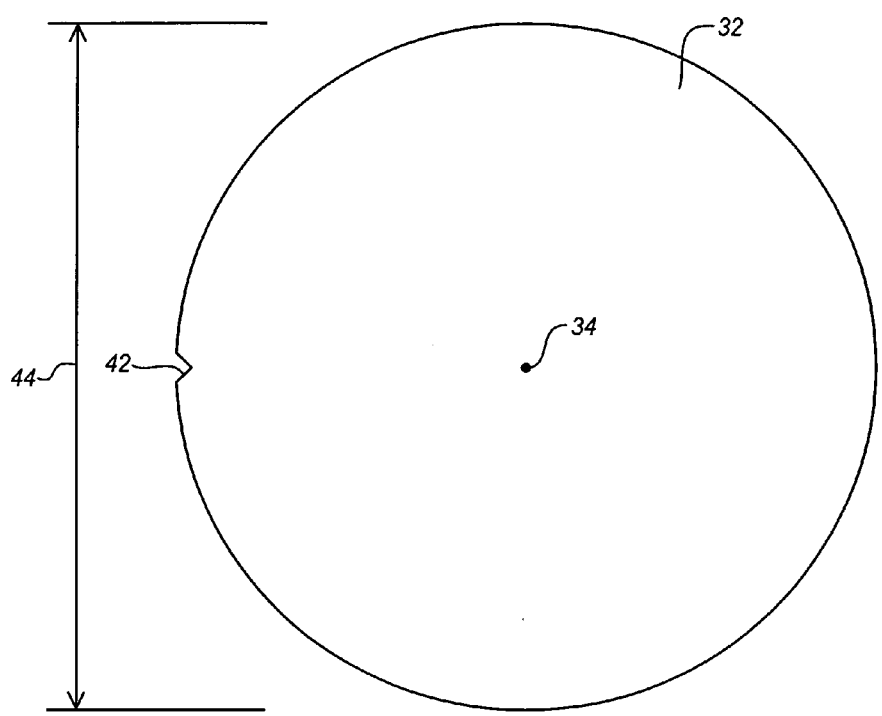
FIG. 2 is a top plan view of a typical semiconductor wafer.
Figure 3:
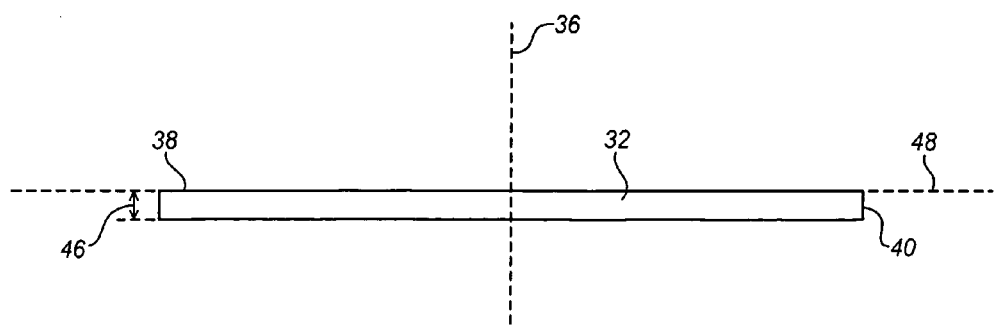
FIG. 3 is a cross sectional side view of the wafer in FIG. 2.

FIGS. 2 and 3 illustrate a typical semiconductor wafer 32. The wafer 32 may be made of s semiconductor material such as silicon and have a center 34, a central axis 36, an upper surface 38, an outer edge 40, and a notch 42. The outer edge 40 may be circular in shape and have a diameter 44 of, for example, 200 or 300 millimeters and a thickness 46 of 1000 microns. The notch 42 may be formed on the outer edge 40 of the wafer 32. The upper surface 38 may be flat and lie in a plane 48 extending beyond the outer edge 40 of the wafer 32. The central axis 36 may intersect and may be perpendicular to the upper surface 38 of the wafer 32 and the plane 48 at the center 34 of the wafer 32. Although not illustrated, the wafer 32 may have a multitude of CMOS circuitry, or other such microelectronic components, formed therein.

Figure 4:
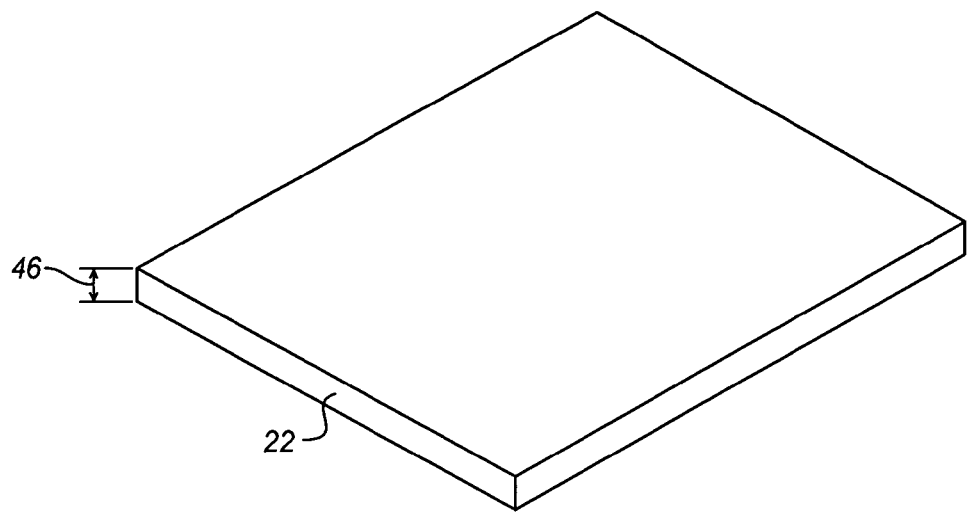
FIG. 4 is perspective view of a substrate, which is a portion of the wafer in FIG. 2.

FIG. 4 illustrates the substrate 22. Although the substrate 22 appears to be rectangular, it should be understood that the substrate 22 may be only a portion of the wafer 32 and may be made of the same materials and have the same thickness 46. It should also be noted that FIGS. 1 through 15 are merely illustrative and are not drawn to scale. FIGS. 4–12 illustrate a single memory array 20 being constructed, however, it should be understood that multiple memory arrays may be replicated on the wafer 32 simultaneously.

Figure 5:
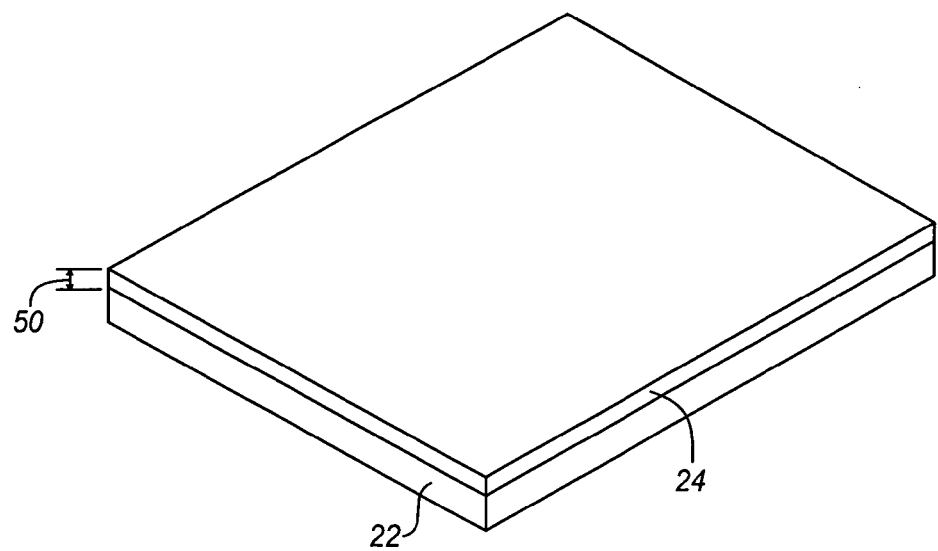
FIG. 5 is perspective view of the substrate with the insulating layer formed thereon.

As illustrated in FIG. 5, the insulating layer 24 may first be formed on the substrate 22. The insulating layer 24, or thermal layer, may made of dielectric material such as silicon oxide and have a thickness 50 of, for example, between 500 and 5000 microns. The insulating layer 24 is formed by deposition process such as chemical vapor deposition (CVD) or thermal growth in a diffusion furnace. The insulating layer 24 will insulate the substrate 22 from conductive layers to be formed thereon.

Figure 6A:
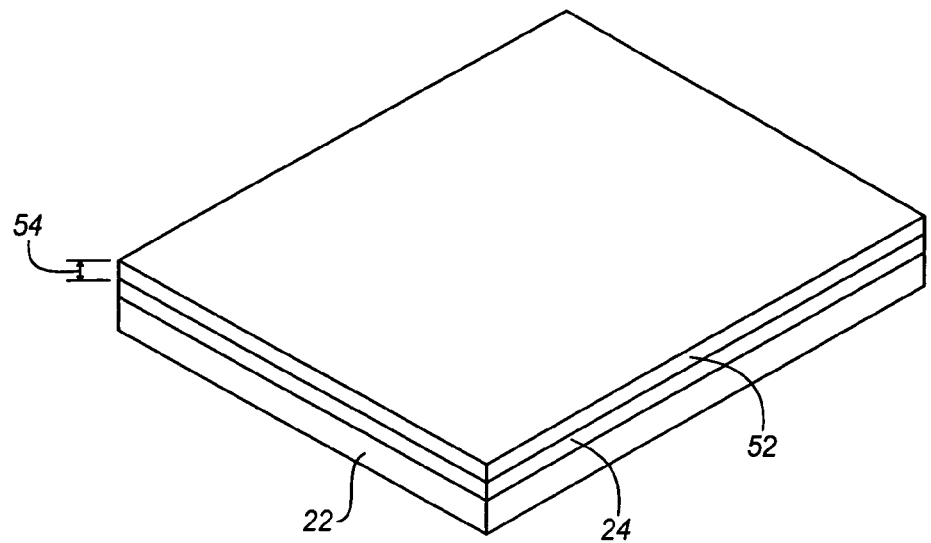
FIG. 6a is a perspective view of the substrate with a lower metal stack formed on the insulating layer.
Figure 6B:
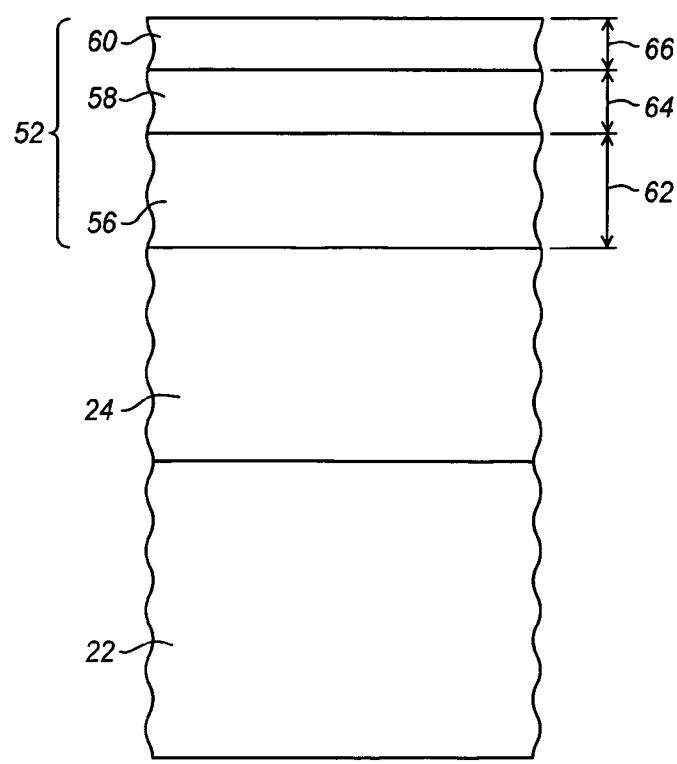
FIG. 6b is a cross sectional side view of a portion of the substrate in FIG. 6A.

As illustrated in FIGS. 6a and 6b, a lower metal stack 52 may then be formed on the insulating layer 24. The lower metal stack 52 may have a thickness 54 of between 500 and 1000 angstroms, and as shown in FIG. 6b, may include multiple layers such as an aluminum layer 56, a titanium layer 58, and a titanium nitride layer 60. The aluminum layer 56 may be sputtered onto the insulating layer 24 and may have a thickness 62 of between 200 and 600 angstroms. The aluminum layer may act as a lower electrode. The titanium layer 58 may then be sputtered onto the aluminum layer 56 and have a thickness 64 of between 100 and 140 angstroms. Next, the titanium nitride layer 60 may be sputtered onto the titanium layer 58 and have a thickness 66 of between 50 and 100 angstroms.

Figure 7:
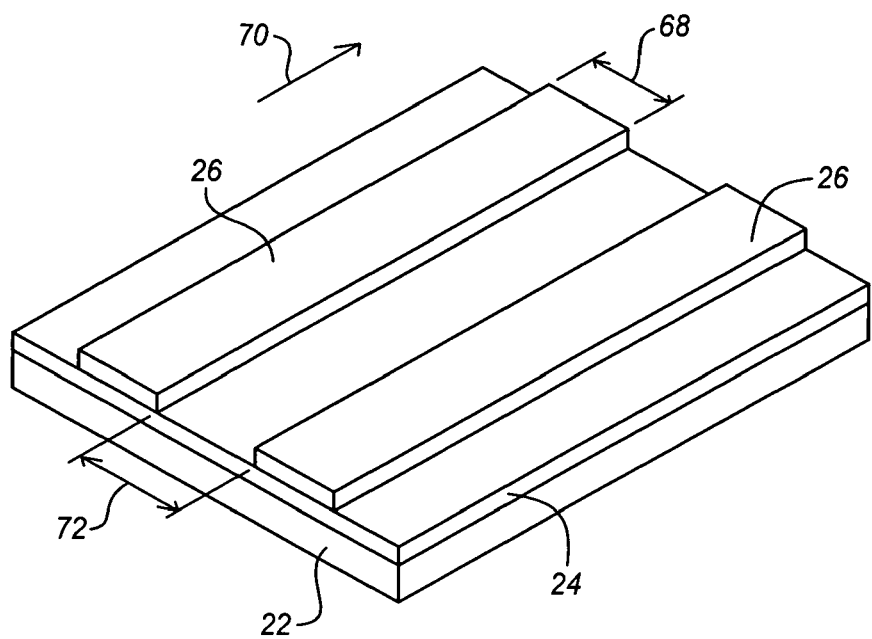
FIG. 7 is a perspective view of the substrate after the lower metal stack has been etched leaving behind the lower metal lines.

The lower metal stack 52, as illustrated in FIG. 7, may then undergo a conventional photolithography and etch process, such as masking a layer of photoresist on an upper surface thereof, exposing the layer, and etching the lower metal stack 52, leaving behind the lower metal lines 26. The lower metal lines 26 may have a width 68 of, for example, 0.15 and 1 micron and extend in a first direction 70. The lower metal lines 26 may lie on a central portion of the insulating layer 24 and may be separated by a distance 72 of, for example, between 0.15 and 1 micron.

Figure 8:
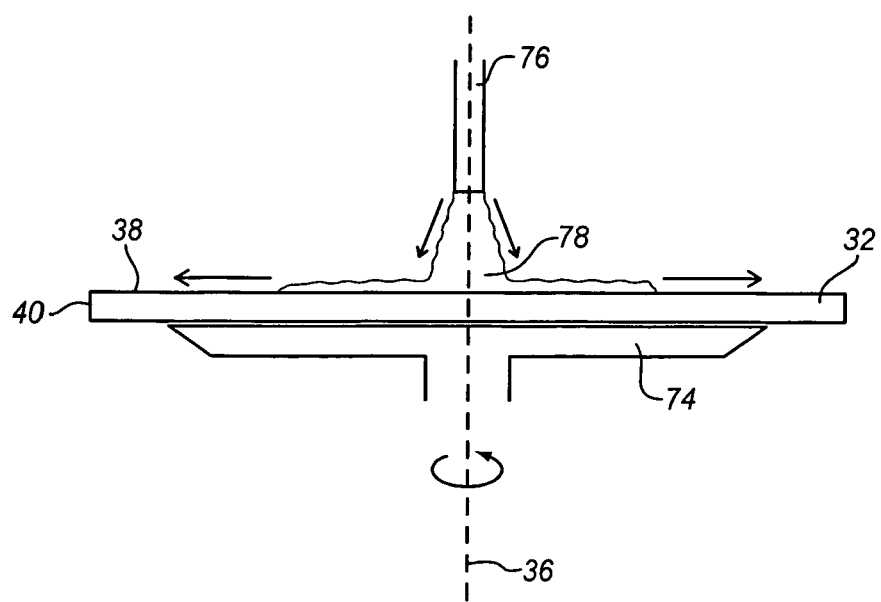
FIG. 8 is a cross sectional side view of the wafer while a polymer solvent is dispensed thereon.

As illustrated in FIGS. 8 and 9, the polymeric layer, or film, 28 may then be deposited onto the insulating layer 24 and over the lower metal lines 26. As shown in FIG. 8, the entire wafer 32 may be placed on a wafer chuck 74, which can rotate about the central axis 36 of the wafer 32. A dispenser head 76 may be placed above the wafer 32 along the central axis 36 of the wafer 32. As the wafer chuck 74 spins the wafer 32 about the central axis 36, a polymer solvent, or solution, 78 may be dispensed from the dispenser head 76. As the polymer solvent 78 contacts the upper surface 38 of the wafer 32, the polymer solvent 78 may be forced towards the outer edge 40 of the wafer 32 due to the centrifugal force created by the rotation of the wafer 32.

The polymer solvent 78 may include, for example, a copolymer consisting of 75 percent Vinyledene Fluoride (VDF) and 25 percent Trifluoroethylene (TFE) dissolved in a casting solvent, such as diethylcarbonate, in which the copolymer is considerably soluble. The wafer 32 may undergo a series of different spin speed cycles after the polymer solvent 78 has been dispensed, with a maximum spin speed of about 3700 rpm, which leaves a layer of the polymer solvent on the upper surface of the wafer with a uniform thickness of, for example, between 600 and 5000 angstroms.

The series of spin speed cycles may include some or all of the following steps. First, the wafer 32 may be rotated for 3 seconds at 3000 rpm while the polymer solvent 78 is dispensed. Next, the wafer may be spun for 2 seconds at 3760 rpm while an edge bead removal (EBR) solvent is dispensed thereon. A longer EBR cycle may be used while the wafer 32 is spun for 2 seconds at 700 rpm, then 2 seconds at 3760 rpm. The wafer 32 may then be spun for 26 seconds at 3760 rpm while no solvent is dispensed thereon, followed by 5 seconds at 1500 rpm. Then the wafer may be spun for 2 seconds at 1500 rpm more EBR solvent is dispensed. Next, the wafer 32 may be spun for 7 seconds at 1500 rpm while EBR solvent is dispensed thereon and a back clean solvent is showered onto a lower surface of the wafer 32 to remove any material that has become deposited thereon. The wafer 32 may then be spun for 7 seconds at 2000 rpm. This entire process of spinning the wafer 32 at different speeds for different amounts of time results in a very thin, substantially uniform polymeric layer being deposited onto the wafer.

After the spin coating process is complete, the wafer 32 may be baked to remove the remaining solvent. The bake may, for example, include raising the wafer to a temperature of approximately 130 degrees Celsius for approximately 90 seconds to remove any residual casting solvent remaining from the spin coating process.

Figure 9A:
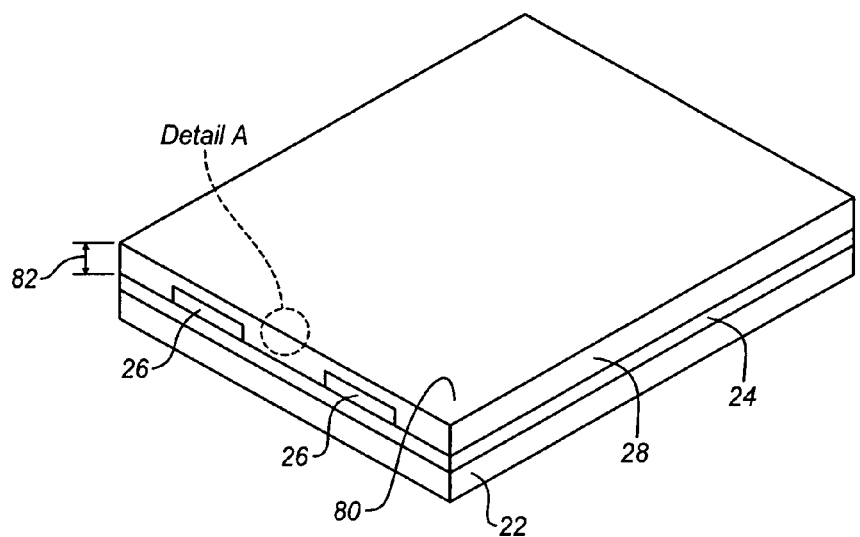
FIG. 9a is a perspective view of the substrate after the polymeric layer has been formed on the insulating layer and over the lower metal lines.

FIG. 9a illustrates the substrate 22 with the polymeric layer 28 having been formed on the insulating layer 24 and over the lower metal lines 26. The polymeric layer 28 has an upper surface 80 and may have a thickness 82 of between 600 and 5000 angstroms.

Figure 9B:
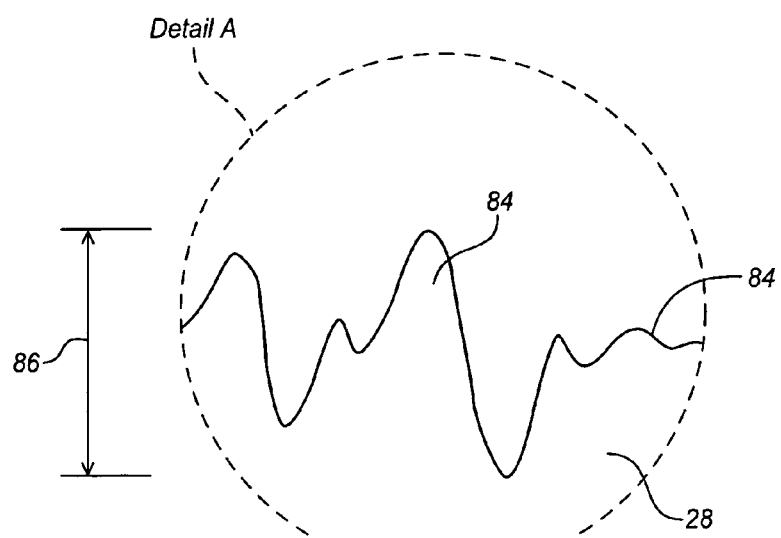
FIG. 9b is a side view on Detail A in FIG. 9a of an upper surface of the polymeric layer.

FIG. 9b illustrates an upper surface 80 of the polymeric layer 28. The upper surface 80 is not completely smooth but may be covered with a series of topographic, or roughness, formations 84. The formations 84 may be a series of raised and recessed areas, and some may have features with heights 86 typically of about 150 angstroms. However, the heights 86 can reach up to 600 angstroms, or the thickness 82 of the polymeric layer 28. Although not illustrated, the formations 84 in the polymeric layer 28 may be gaps, which extend to the insulating layer 24 or the lower metal lines 26 below.

Figure 10:
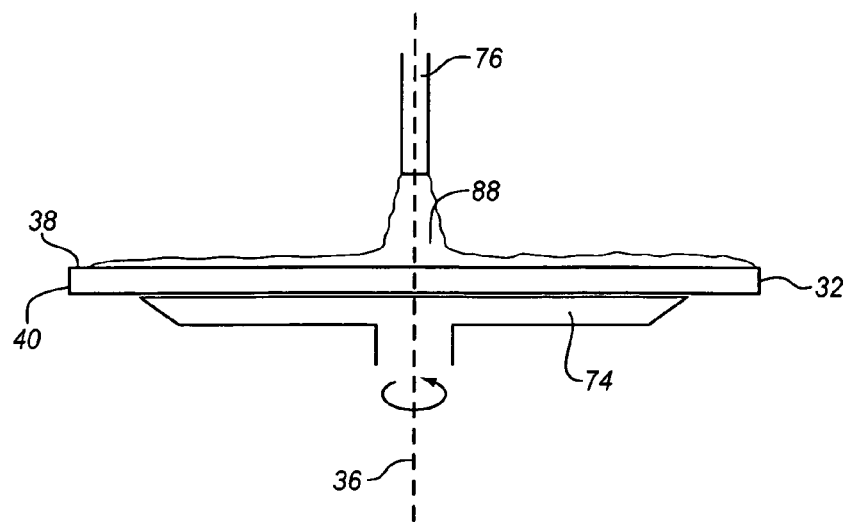
FIG. 10 is a cross sectional side view of the wafer while a smoothing solvent is dispensed thereon.

Next, as illustrated in FIG. 10, the wafer 32 may be placed back onto the wafer chuck 74 with the dispenser head 76 located above. A smoothing solvent 88 may be dispensed from the dispenser head 76 and may cover the entire upper surface 38 of the wafer 32, exposing the wafer 32 to a smoothing medium. Accordingly, the smoothing medium may include a solvent. The smoothing solvent 88 may be a solvent such as ethyl lactate, in which the polymeric layer 28 is only partially, or sparingly, soluble. A puddle of die smoothing solvent 88 may be allowed to stand on the wafer for between 5 and 20 minutes depending on the solvent used, the thickness of the polymeric layer 28, and the degree of smoothing desired. Because the polymer is far less soluble in the smoothing solvent 88, the polymeric layer 28 does not completely dissolve but only partially absorbs some of the smoothing solvent 88. The puddle may have a maximum depth of approximately 2 mm. The polymeric layer 28 does not completely dissolve in the smoothing solvent 88 but experiences a slight swelling as some of the smoothing solvent penetrates the layer 28. Accordingly, a film on a semiconductor substrate may be exposed to a smoothing medium to reduce a height of a plurality of roughness formations on a surface thereof.

Once the degree of smoothing has been obtained, the film may be removed from the smoothing medium. The wafer 32 may be then spun by the wafer chuck 74 to remove the standing puddle of smoothing solvent 88, and then baked again. This bake may include, for example, heating the wafer 32 to a temperature of 110 degrees Celsius for two minutes to remove any residual smoothing solvent 88.

Figure 11A:
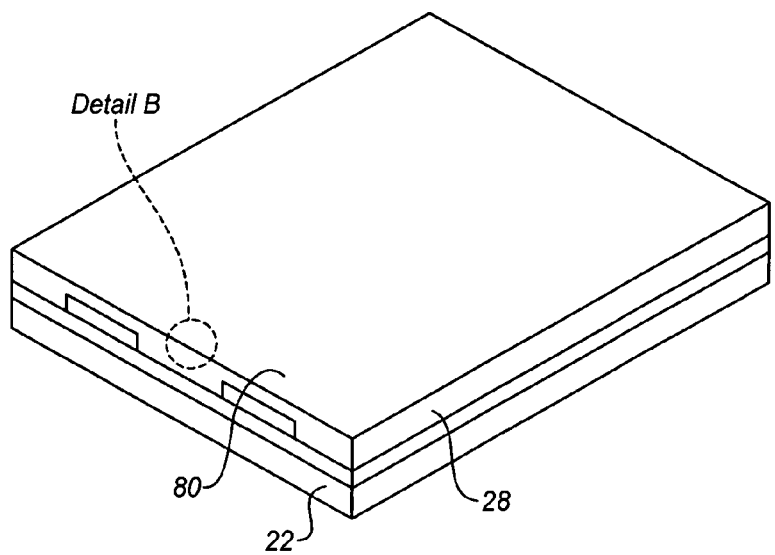
FIG. 11a is a perspective view of the substrate after the smoothing solvent has been removed from the wafer.
Figure 11B:
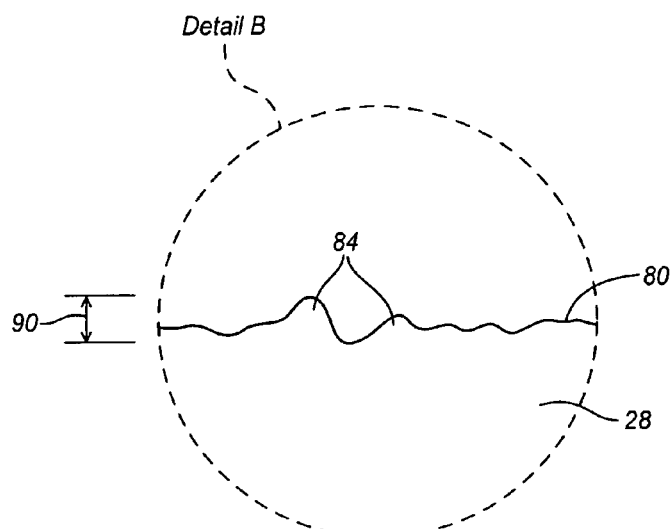
FIG. 11b is a side view on Detail B in FIG. 11a of the upper surface of the polymeric layer.

FIGS. 11a and 11b illustrate the substrate 22 and the upper surface 80 of the polymeric layer 28 after the smoothing solvent 88 has been removed. The roughness formations 84 now have a reduced height 90, such as 50 angstroms, which is considerably less than the first height 86. The reduced formation height 90 leaves the upper surface 80 of the polymeric layer 28 with a smoother texture.

Figure 12A:
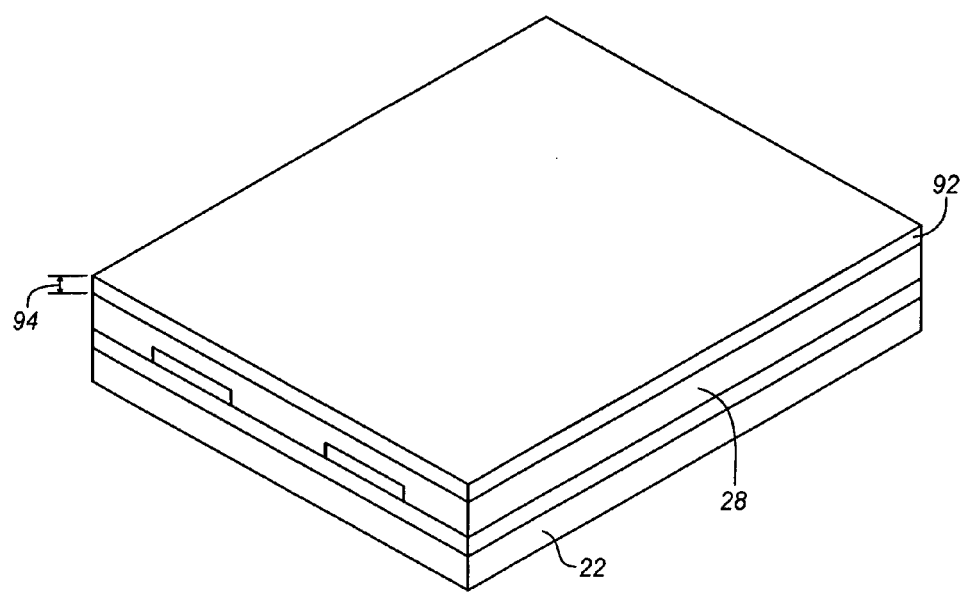
FIG. 12a is perspective view of the substrate with an upper metal stack formed on the polymeric layer.
Figure 12B:
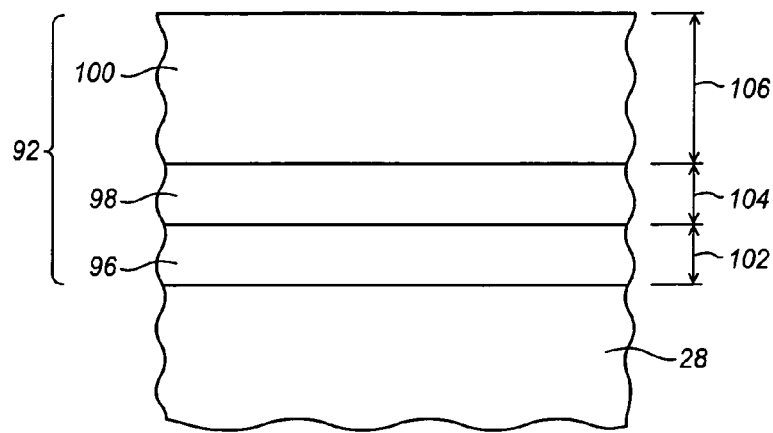
FIG. 12b is a cross sectional side view of a portion of the upper metal stack and the polymeric layer.

Next, as illustrated in FIGS. 12a and 12b, an upper metal stack 92 may be formed on the upper surface 80 of the polymeric layer 28. The upper metal stack 92 may have a thickness 94 of, for example, between 600 and 1000 angstroms, and as illustrated in FIG. 12b, may include multiple layers such as a titanium oxide layer 96, a titanium layer 98, and an aluminum layer 100. The titanium oxide layer 96 may then be formed directly on the polymeric layer 28 by a deposition process, such as atomic layer deposition (ALD), to a thickness 102 of, for example between 50 and 150 angstroms. The titanium layer 98 may then be formed on the titanium oxide layer 96 by ALD to a thickness 104 of, for example, between 30 and 70 angstroms, and the aluminum layer 100 may then be formed on the titanium layer 98 to a thickness 106 of, for example, between 200 and 600 angstroms.

Other methods may be used to form the various layers of the memory array 20 such as thermal evaporation, plating, chemical vapor deposition (CVD), ion beam sputtering, and electroless plating. However, because of the heat generated, sputtering does not work well for forming the upper metal stack 64. Furthermore, other materials may be used in the various layers of the metal stacks such as tantalum, tantalum nitride, and tantalum oxide.

Figure 13:
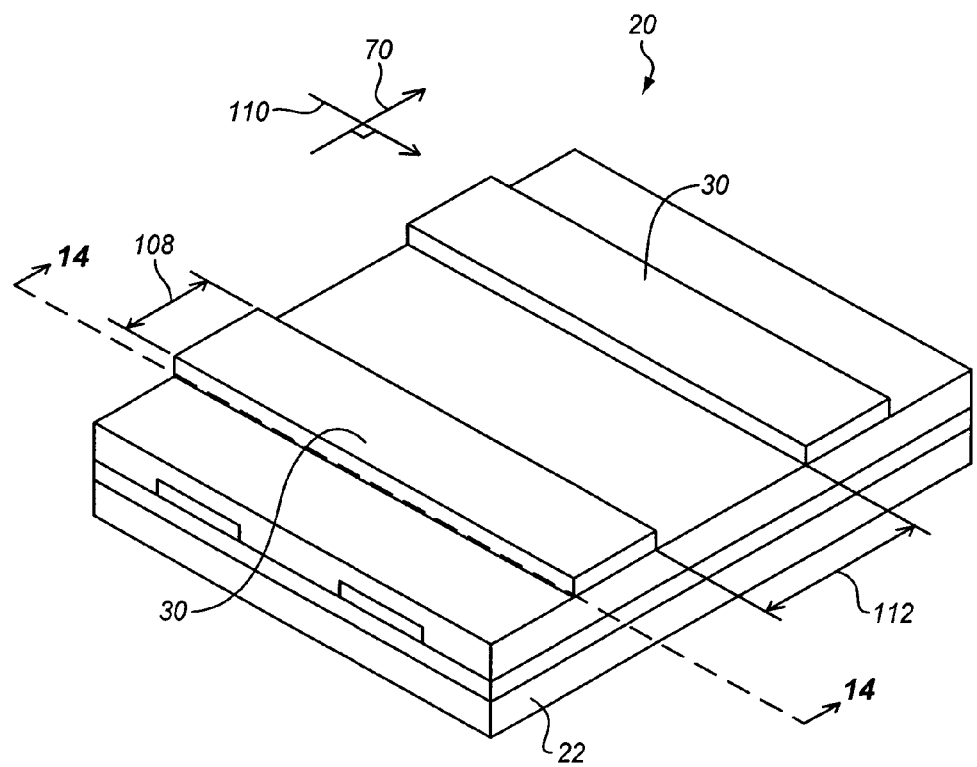
FIG. 13 is a perspective view of the substrate after the upper metal stack has been etched leaving behind the upper metal lines.

As illustrated in FIG. 13, the upper metal stack 92 may then undergo a conventional photolithography and etch process leaving behind the upper metal lines 30. The upper metal lines 30 may have a width 108 of, for example, between 0.15 and 1 micron and extend in a second direction 110, which is perpendicular to the first direction 70. The upper metal lines 30 may lie on a central portion of the upper surface 80 of the polymeric layer 28 and may be separated by distance 112 of, for example, 0.15 and 1 micron. FIG. 13 illustrates the completed ferroelectric polymer memory array 20, which includes four memory cells 114.

Figure 14:
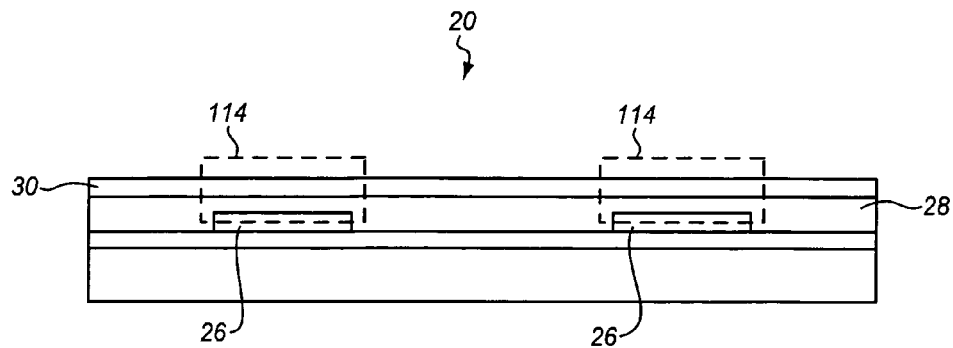
FIG. 14 is a cross sectional side view on 14—14 in FIG. 13 of the memory array including two memory cells.

FIG. 14 illustrates two memory cells 114 of the memory array 20. Each upper metal line 30 may cross over both lower metal lines 26. Each memory cell 114 may be formed by sections, or portions, of the upper 30 and the lower 26 metal lines, which directly oppose each other with a section of the polymeric layer 28 lying between.

Figure 15:
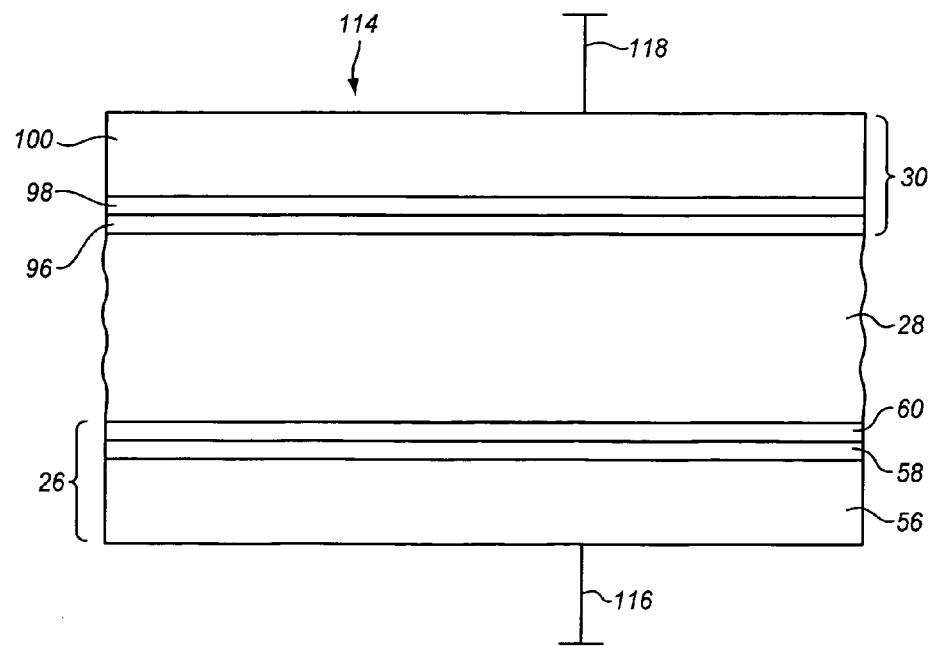
FIG. 15 is a cross sectional side view of one of the memory cells.

FIG. 15 illustrates one of the memory cells 114. The memory cell 114 may include a section of a lower metal line 26, a section of the polymeric layer 28, and a section of an upper metal line 30. The section of the lower metal line 26 may include the aluminum 56, the titanium 58, and the titanium nitride 60 layers that were formed in the lower metal stack 52. The section of the upper metal line 30 may include the different layers of titanium oxide 96, titanium 98, and aluminum 100 that were formed in the upper metal stack 92. Although not shown in detail, the titanium oxide layer 96 may act as an interface and completely separate the titanium layer 98 from the polymeric layer 28.

Although the embodiment shown contains only two layers of metal lines and one layer of polymer, it should be understood that the number of levels of the memory array 20 may be increased to "stack" memory cells on top of one another. Although not shown, when the memory arrays 20 on the wafer 32 are complete, the wafer may be sawed into individual microelectronic dies, which are packaged on packaged substrates and eventually attached to circuit boards. The circuit boards are typically placed in electronic devices such as computers.

As shown schematically in FIG. 15, the aluminum layer 56 of the lower metal line 26 may be a lower conductive electrode and may be connected to a first electric terminal 116. The aluminum layer 100 of the upper metal line 30 may be an upper conductive electrode and may be connected to a second electric terminal 118.

In use, a first voltage may be applied across the first 116 and second 118 electric terminals. The first voltage may cause dipoles contained in the polymer to align themselves in a particular orientation. After the first voltage is released from the first 116 and the second 118 electric terminals, the polymer retains the orientation of the dipoles therein, and thus the polymer located between the lower 26 and upper 30 metal lines maintains a particular polarization or charge. A second voltage, of an opposite polarity, may be applied across the first 116 and second 118 electric terminals to reverse the orientation, and therefore, the polarization or charge of the dipoles within the polymer. The presence or absence of a particular charge in one of the cells 114 may be used to store either a 0 or a 1 of a memory bit. Other electric signals may be sent through the first 116 and second 118 electric terminals to detect the polarization of the polymer and thus read the memory of the bit of information.

The polymeric layer 28 is reactive with the electrodes. The various layers between the electrodes and the polymeric layer 28 are far less reactive with either. Therefore, these layers serve to separate the electrodes from the polymeric layer 28 so that no chemical reaction occurs, which leads to the breakdown of the device.

One advantage is that the performance of the memory array is improved as charge retention performance is increased. Smoother films result in better contact with the electrode systems used to program the polymer to hold memory bits. Another advantage is that due to the smoother upper surface of the polymeric layer, the ease and precision of the lithography and etch process of the upper metal stack is increased so that smaller and more accurate metal lines can be produced. Furthermore, the risk of metal stringers being left behind in the valleys of a rough film that cause shorts between the metal lines in the device is reduced. A further advantage is that the interface layer, because of the improved texture of the polymeric layer, provides a complete separation between the polymeric layer and the electrodes. Thus, the polymeric layer and the electrodes do not make contact and no chemical reaction between the two takes place. Therefore, the reliability and longevity of the memory array is improved.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method comprising:
reducing a height of a plurality of roughness formations on a surface of a film over a semiconductor substrate by exposing the film to a smoothing medium,
wherein the roughness formations have a first height before said exposure and a second height after said exposure, the second height being less than the first height.

2. The method of claim 1, further comprising removing the film from the smoothing medium.

3. The method of claim 2, wherein the film comprises a copolymer.

4. The method of claim 3, wherein the copolymer comprises at least one of Vinyledene Flouride and Triflouroethlyene.

5. The method of claim 4, wherein the semiconductor substrate comprises a semiconductor wafer.

6. The method of claim 5, further comprising forming the film over the semiconductor wafer, said forming occurring while the semiconductor wafer is spun.

7. The method of claim 6, wherein the smoothing medium comprises a solvent.

8. The method of claim 7, wherein the solvent comprises ethyl lactate.

9. A method comprising:

dispensing a smoothing solvent onto a film over a semiconductor substrate, the film having a plurality of roughness formations on a surface thereof, the roughness formations having a first height; and removing the smoothing solvent from the film, the roughness formations having a second height after said removal, the second height being less than the first height.

10. The method of claim 9, wherein the film comprises a spun film.

11. The method of claim 10, wherein the film comprises a copolymer.

12. The method of claim 11, wherein the semiconductor substrate comprises a wafer.

13. The method of claim 12, wherein the wafer is spun to remove the smoothing solvent.

14. A method comprising:

spinning a semiconductor wafer about a central axis thereof;

dispensing a polymer on the semiconductor wafer during said spinning to form a polymeric film thereon, the polymeric film having a plurality of roughness formations on a surface thereof, the roughness formations having a first height;

heating the semiconductor wafer;

dispensing a smoothing solvent onto the film; and removing the smoothing solvent from the film by spinning the semiconductor wafer about the central axis thereof, the roughness formations having a second height after said removal, the second height being less than the first height.

15. The method of claim 14, wherein the central axis of the wafer is perpendicular to an upper surface thereof.

16. The method of claim 15, wherein the polymer comprises a copolymer.

17. The method of claim 1, wherein said exposing the film to the smoothing medium comprises allowing a puddle of solvent to stand on the film.

18. The method of claim 17, wherein said allowing the puddle of solvent to stand on the film comprises allowing the puddle of solvent to stand on the film for at least five minutes.

19. The method of claim 1, further comprising:

forming an electrode over the film after said reducing the height of the plurality of roughness formations; and programming a portion of the film to hold a bit by using the electrode.

20. The method of claim 1, wherein the film comprises a ferroelectric polymer.

21. The method of claim 9, further comprising allowing a puddle of the smoothing solvent to stand on the film.

22. The method of claim 9, wherein the film comprises a ferroelectric polymer, further comprising forming an electrode over the film after said removing the smoothing solvent from the film.

* * * * *